United States Patent
Jang (10) Patent No.: US 8,124,479 B2
(45) Date of Patent: Feb. 28, 2012

(54) DIFFUSING IMPURITY IONS INTO PILLARS TO FORM VERTICAL TRANSISTORS

(75) Inventor: Tae Su Jang, Gwacheon (KR)

(73) Assignee: Hynix Semiconductor Inc., Icheon (KR)

( * ) Notice: Subject to any disclaimer, the term of this patent is extended or adjusted under 35 U.S.C. 154(b) by 32 days.

(21) Appl. No.: 12/947,087

(22) Filed: Nov. 16, 2010

(65) Prior Publication Data

US 2012/0021575 A1   Jan. 26, 2012

(30) Foreign Application Priority Data

Jul. 20, 2010   (KR) .................. 10-2010-0069951

(51) Int. Cl.
*H01L 21/336* (2006.01)
*H01L 21/425* (2006.01)

(52) U.S. Cl. ............... 438/268; 438/530; 257/E21.629

(58) Field of Classification Search .............. 438/268; 257/E21.629

See application file for complete search history.

(56) References Cited

U.S. PATENT DOCUMENTS

| 5,519,236 A | * | 5/1996 | Ozaki ............................ 257/302 |
| 2001/0046754 A1 | * | 11/2001 | Takasu .......................... 438/440 |
| 2003/0003723 A1 | * | 1/2003 | Lee ............................... 438/664 |
| 2004/0046200 A1 | * | 3/2004 | Wu ............................... 257/301 |
| 2006/0197114 A1 | * | 9/2006 | Geshi et al. .................... 257/229 |
| 2007/0228897 A1 | * | 10/2007 | Umeki ........................... 310/370 |
| 2007/0235833 A1 | * | 10/2007 | Cheng et al. ................... 257/506 |
| 2010/0013005 A1 | * | 1/2010 | Roesner et al. ................. 257/329 |
| 2011/0070720 A1 | * | 3/2011 | Ohtsuka ......................... 438/424 |
| 2011/0073939 A1 | * | 3/2011 | Mikasa .......................... 257/330 |

FOREIGN PATENT DOCUMENTS

KR   20090066488 A   6/2009
KR   20090123678 A   12/2009

* cited by examiner

*Primary Examiner* — Kevin Parendo (57) ABSTRACT

A method for manufacturing a semiconductor device that includes forming a pillar pattern including a sidewall contact over a semiconductor substrate; forming a silicon layer in a lower portion disposed between the pillar patterns; implanting ions into the silicon layer; diffusing the implanted impurity ions into the inside of the pillar pattern to form an ion-implanting region; removing the silicon layer; and burying a conductive material in the lower portion disposed between the pillar patterns. The method can prevent a floating body effect by adding a process of a vertical channel transistor.

17 Claims, 7 Drawing Sheets

DIFFUSING IMPURITY IONS INTO PILLARS TO FORM VERTICAL TRANSISTORS

CROSS-REFERENCE TO RELATED APPLICATION

The priority of Korean patent application No. 10-2010-0069951 filed on Jul. 20, 2010, the disclosure of which is hereby incorporated in its entirety by reference, is claimed.

BACKGROUND OF THE INVENTION

An embodiment of the present invention relates to a method for manufacturing a semiconductor device, and more specifically, to a method for manufacturing a semiconductor device including a vertical transistor.

Due to increase in integration of a semiconductor device, a channel length of a transistor has been gradually decreased. However, is the decrease in the channel length of the transistor causes short channel effects such as a drain induced barrier lowering (DIBL) phenomenon, a hot carrier effect and a punch through phenomenon. In order to prevent the short channel effects, various methods have been suggested, i.e. a method of reducing a depth of a junction region or a method of forming a recess in a channel region of a transistor to increase a channel length.

However, as integration density of a semiconductor memory device, specifically, DRAM is edged up to giga bit, a smaller-sized transistor is required. That is, a transistor of DRAM having giga bit requires a unit cell area of less than 8F2 (F: minimum feature size) or of 4F2. As a result, it is difficult to satisfy the required unit cell area even though a channel length of a current plannar-structured transistor is scaled down that comprises a gate electrode formed over a semiconductor substrate and a junction region formed at both sides of the gate electrode. In order to meet the unit cell size requirement, a vertical channel transistor structure has been suggested.

In the vertical channel transistor, a source/drain region is formed in upper and lower portions of a silicon pillar, and a body (where a channel is formed) of the transistor is electrically floated. This configuration causes off-state leakage. That is, even when the transistor is not activated, holes which are positive charges are piled up in the body due to gate induced drain leakage (GIDL) or hot carrier injection. As a result, a threshold voltage of the transistor is lowered, and off-leakage of the transistor is increased. These phenomena cause mal-operation of a logic circuit and loss of information from a cell capacitor.

BRIEF SUMMARY OF THE INVENTION

Various embodiments of the invention are directed to a method for manufacturing a semiconductor device that can prevent a floating body effect.

According to an embodiment of the present invention, a method for manufacturing a semiconductor device comprises: forming pillar patterns including a sidewall contact over a semiconductor substrate, the pillar patterns including first and second pillar patterns; forming a silicon layer between the first and second pillar patterns; implanting impurity ions into the silicon layer; diffusing the implanted impurity ions into the pillar patterns to form an ion-implanting region; removing the silicon layer after forming the ion-implanting region; and forming a conductive pattern between the first and second pillar patterns, the conductive pattern electrically coupling the ion-implanting region.

The forming-a-silicon-layer includes forming the silicon layer by a Silicon Epitaxial Growth (SEG) method. The first pillar pattern includes silicon material, and wherein the SEG method is performed using the first pillar pattern exposed by the sidewall contact as a seed. The implanting-ions-into-the-silicon-layer is performed by a plasma doping process or a diffusion furnace process. The impurity ions have opposite conductivity to the semiconductor substrate. The impurity ions of the implanting-ions-into-the-silicon-layer include any of P, As and a combination thereof, and wherein the semiconductor substrate is a p-type.

The impurity ions of the implanting-ions-into-the-silicon-layer include any of B, $BF_2$ and a combination thereof, and wherein the semiconductor substrate is a n-type. The impurity ions of the implanting-ions-into-the-silicon-layer are implanted with a concentration ranging from 1E10 to 1E20 dose/$cm^2$ using an energy ranging from about 1 to about 100 KeV. The impurity ions of the implanting-ions-into-the-silicon-layer are diffused into the inside of the pillar patterns through the sidewall contact.

The ion-implantation region is used as a source/drain region. The implanting-ions-into-the-silicon-layer includes performing a thermal treatment process on the silicon layer. The thermal treatment process is performed under an inert gas atmosphere. The thermal treatment process is performed with an inert gas including any of $N_2$, Ar and a combination thereof. The removing-the-silicon-layer is performed by a dry etching process. The method further comprising forming a barrier metal layer between the ion-implanting region and the conductive pattern.

The barrier metal layer includes any of Ti, TiN and combinations thereof. The forming-a-conductive-material further includes: forming a conductive material over the semiconductor substrate, the conductive material filling a space between the pillar patterns; and etching the conductive material by an etch-back process so that the conductive material remains in a lower portion of the space between is the pillar patterns. The conductive material includes tungsten.

According to an embodiment of the present invention, The method comprising: forming a pillar pattern over a semiconductor substrate; forming a first diffusion barrier layer over a first sidewall of the pillar pattern; forming a sidewall contact hole penetrating the first diffusion barrier layer to expose the pillar pattern; forming a silicon layer filling in the sidewall contact hole; implanting impurities into the silicon layer; and diffusing the impurities into the pillar pattern through the sidewall contact hole to form a first doped region along the first sidewall of the pillar pattern. The method further comprising: removing the silicon layer; and forming a conductive pattern over the doped region so that the conductive pattern is electrically coupled to the doped region, wherein the silicon layer filling in the sidewall contact hole is formed extending over the first diffusion barrier layer.

DESCRIPTION OF EMBODIMENTS

The present invention will be described in detail with reference to the attached drawings.

FIGS. 1 to 7 are cross-sectional diagrams illustrating a method for manufacturing a semiconductor device.

Figure 1:
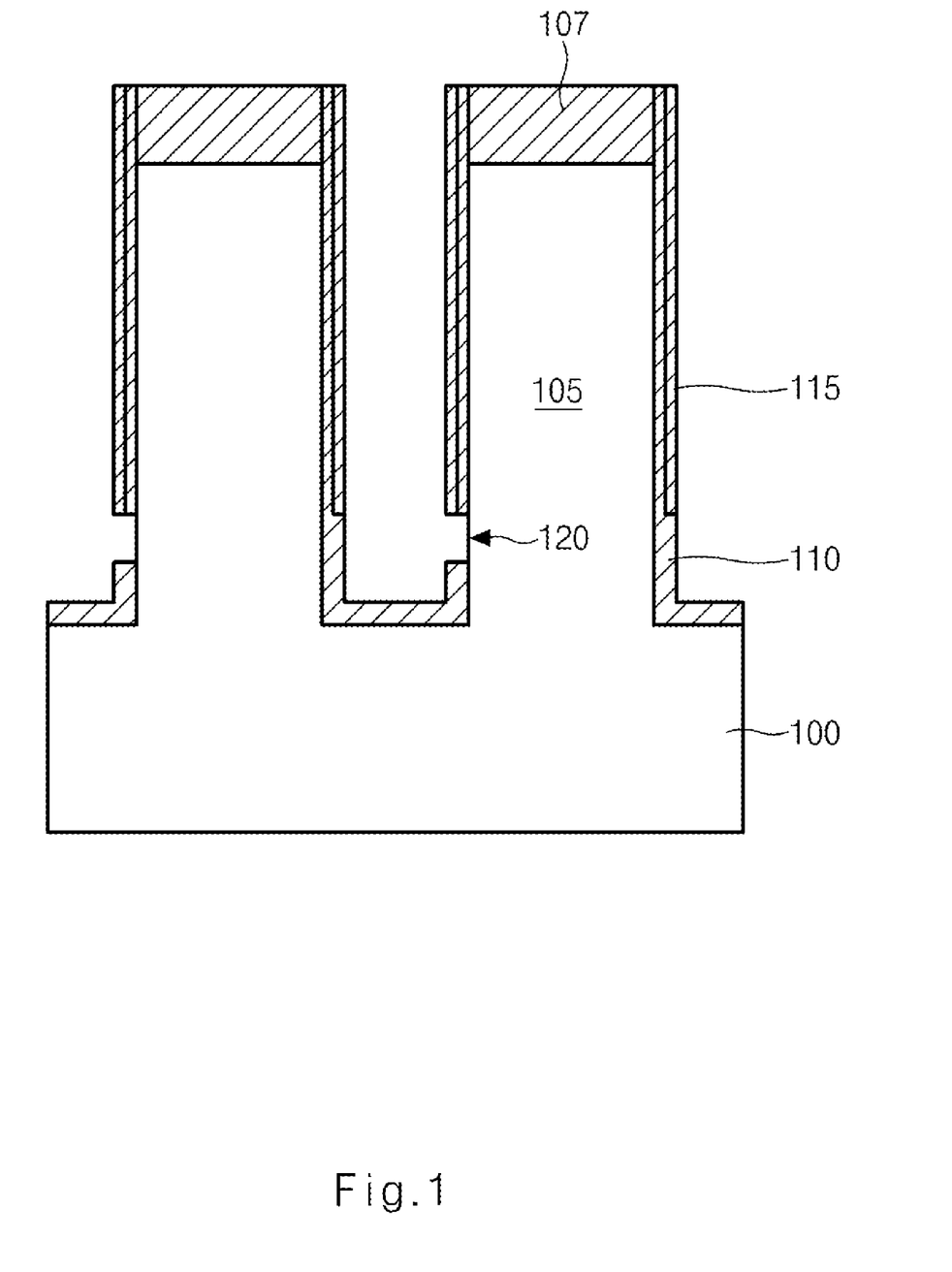
FIGS. 1 to 7 are cross-sectional diagrams illustrating a method for manufacturing a semiconductor device.

Referring to FIG. 1, a plurality of pillar patterns 105 each including a sidewall contact 120 are disposed over a semiconductor substrate 100. In order to form the pillar pattern 105, a hard mask pattern 107 that defines a pillar region is formed over the semiconductor substrate 100, and the semiconductor substrate 100 is etched with the hard mask pattern 107 as an etching mask. The sidewall contact 120 is formed to expose a first sidewall of the pillar pattern by partly patterning a silicon oxide film 110 and a liner nitride film 115 formed over the sidewall of the pillar pattern 105.

Figure 2:
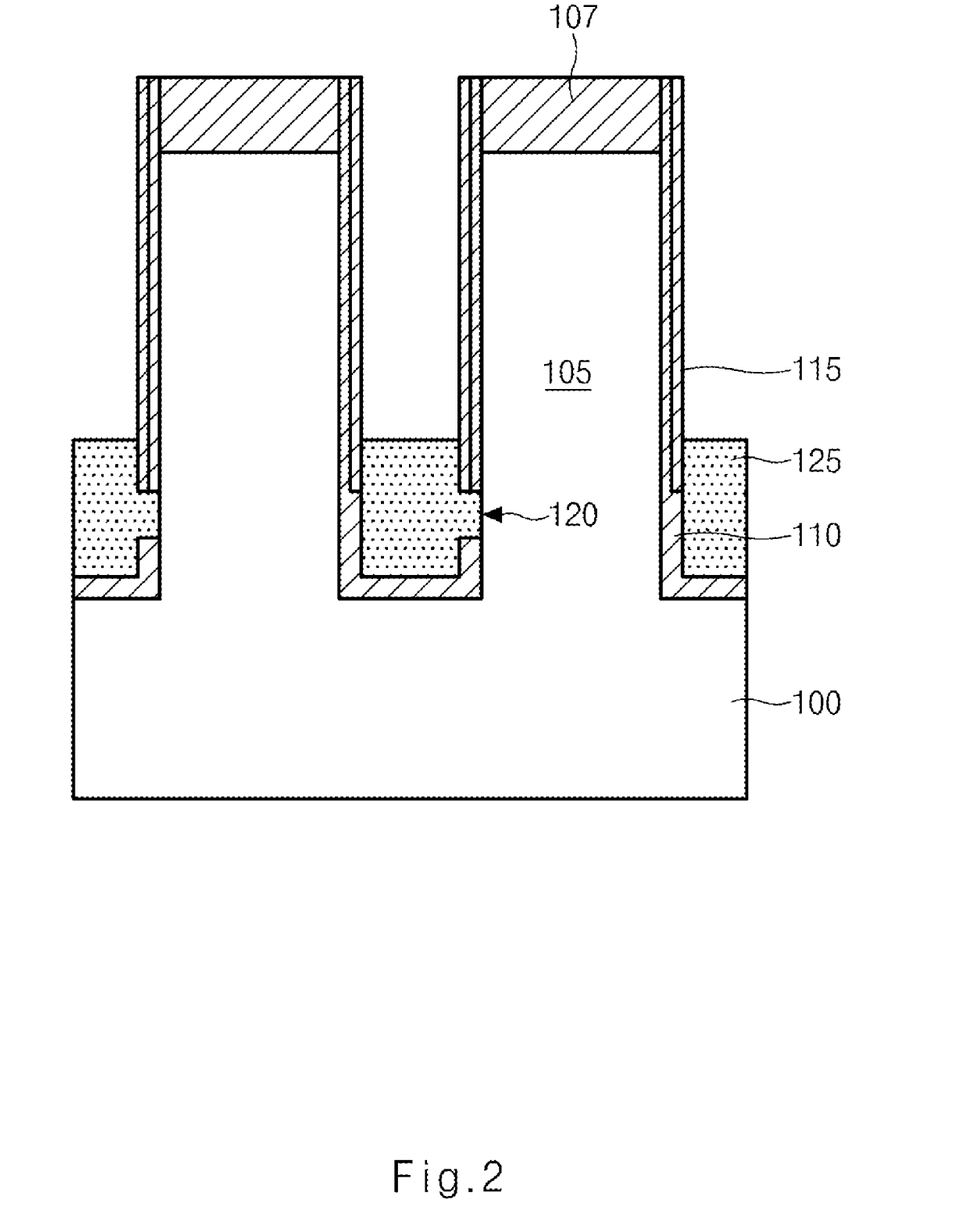

Referring to FIG. 2, a silicon layer 125 is formed between the pillar patterns 105 so as to fill in the sidewall contact 120. The silicon layer 125 may be formed of any of undoped polysilicon and doped polysilicon. Preferably, the silicon layer 125 includes undoped polysilicon. The silicon layer 125 is grown by a Silicon Epitaxial Growth (SEG) method using a silicon layer of the pillar pattern 105 exposed by the sidewall contact 120 as a seed. By the SEG method, the silicon layer 125 is grown toward the top portion and the side surface so that the silicon layer 125 may contact the silicon oxide film 110 and the liner nitride film 115 formed over a second sidewall of the adjacent pillar pattern 105. The second sidewall of the adjacent pillar pattern 105 is formed on an opposite side to the first sidewall. The silicon layer 125 is grown with a thickness ranging from 10 to 500 μm so that a lower space between the adjacent pillar patterns 105 may be completely filled up.

The silicon layer 125 is formed to contact the silicon oxide is film 110 and the liner nitride film 115 of the adjacent pillar pattern 105 so that impurity ions may not be implanted into the pillar pattern 105 except through the sidewall contact 120 in a subsequent process of implanting impurity ions. That is, the liner nitride film 115 and the silicon oxide film 110 serve as barriers during the subsequent process of implanting impurity ions.

The silicon layer 125 is etched by a dry etch process so as to adjust the regular thickness of the silicon layer 125. When the silicon layer 125 is grown to have a given thickness, a recess process via an additional etch process may be omitted.

Figure 3:
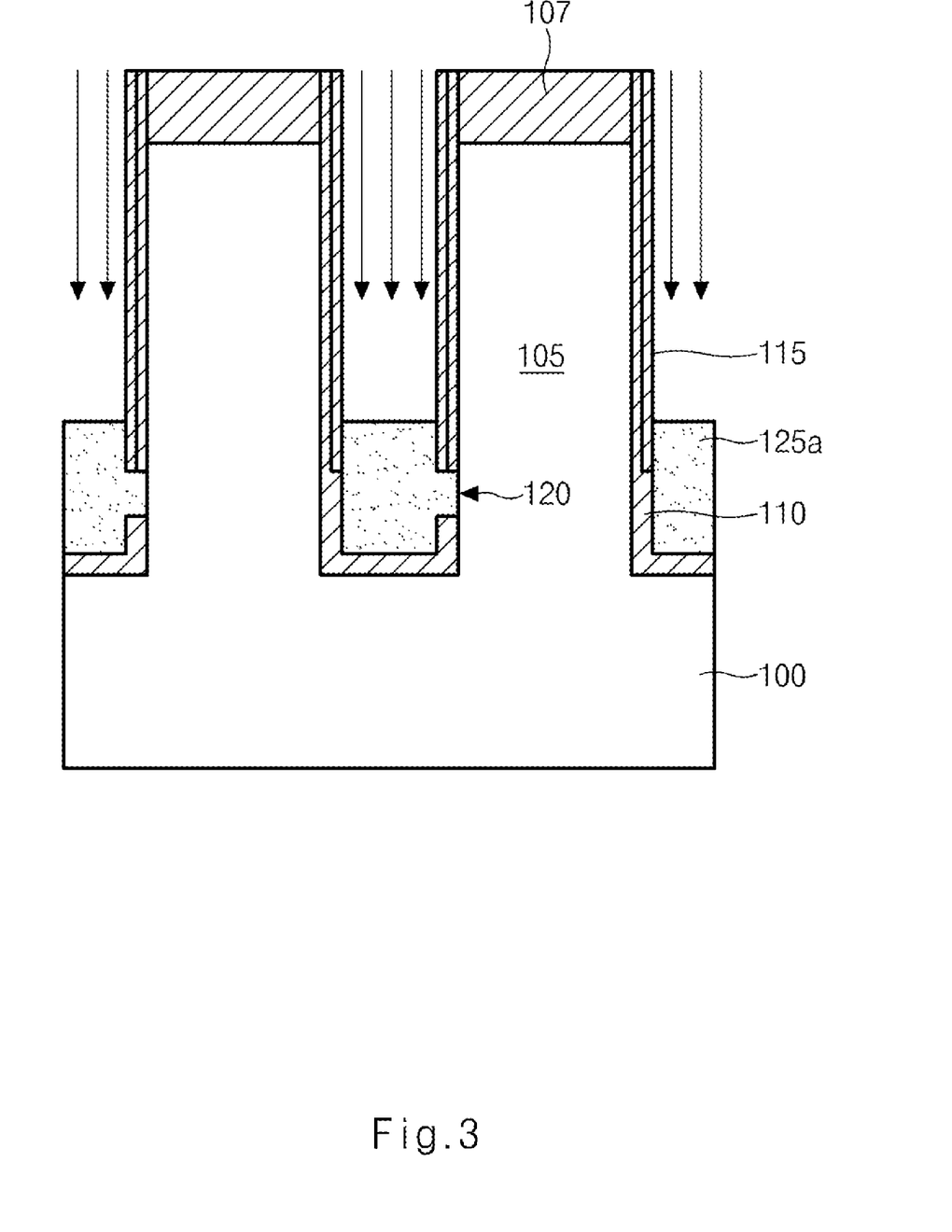

Referring to FIG. 3, a process of doping impurity ions into the silicon layer 125 is performed. The ion-implanting method (or impurity doping process) includes an ion implantation process, a plasma doping process or a diffusion furnace process. The impurity ions implanted by the ion implantation process have the opposite type of polarity to the semiconductor substrate 100. For example, n-type impurity ions are implanted when the semiconductor substrate 100 has a p-type, and p-type impurity ions are implanted when the semiconductor substrate 100 has a n-type. The n-type impurity ions include any of P, As and combinations thereof. The p-type impurity ions include any of B, $BF_2$ and combinations thereof. The impurity ions may be implanted with a concentration ranging from 1E10 to 1E20 dose/$cm^2$ using an energy ranging from about 1 to about 100 KeV.

Figure 4:
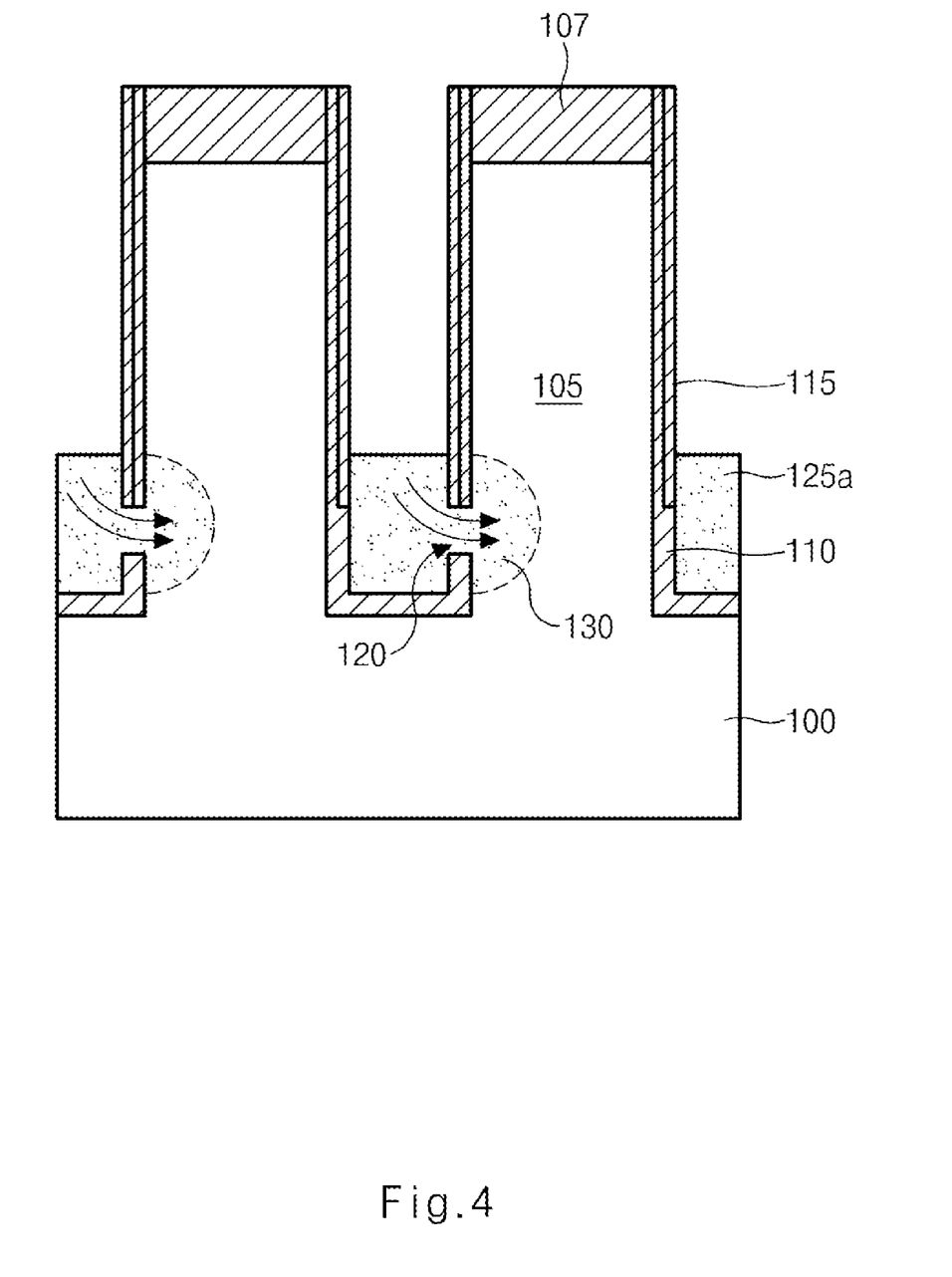

Referring to FIG. 4, the impurity ions implanted into the doped is silicon layer 125a are diffused into the inside of the pillar pattern 105 by a thermal treatment process. The diffusion of impurity ions is performed through the sidewall contact 120 of the pillar pattern 105. The ion-implanting region 130 in the pillar pattern 105 serves as a first source/drain region. The ion-implanting region 130 formed in the pillar pattern 105 does not extend to the second sidewall of the pillar pattern 105.

The thermal treatment process is performed under an inert gas atmosphere. For example, an inert gas includes any of $N_2$, Ar and combinations thereof. The thermal treatment process is performed at a temperature ranging from about 400 to about 1200° C. for about 10 to about 3600 seconds.

Figure 5:
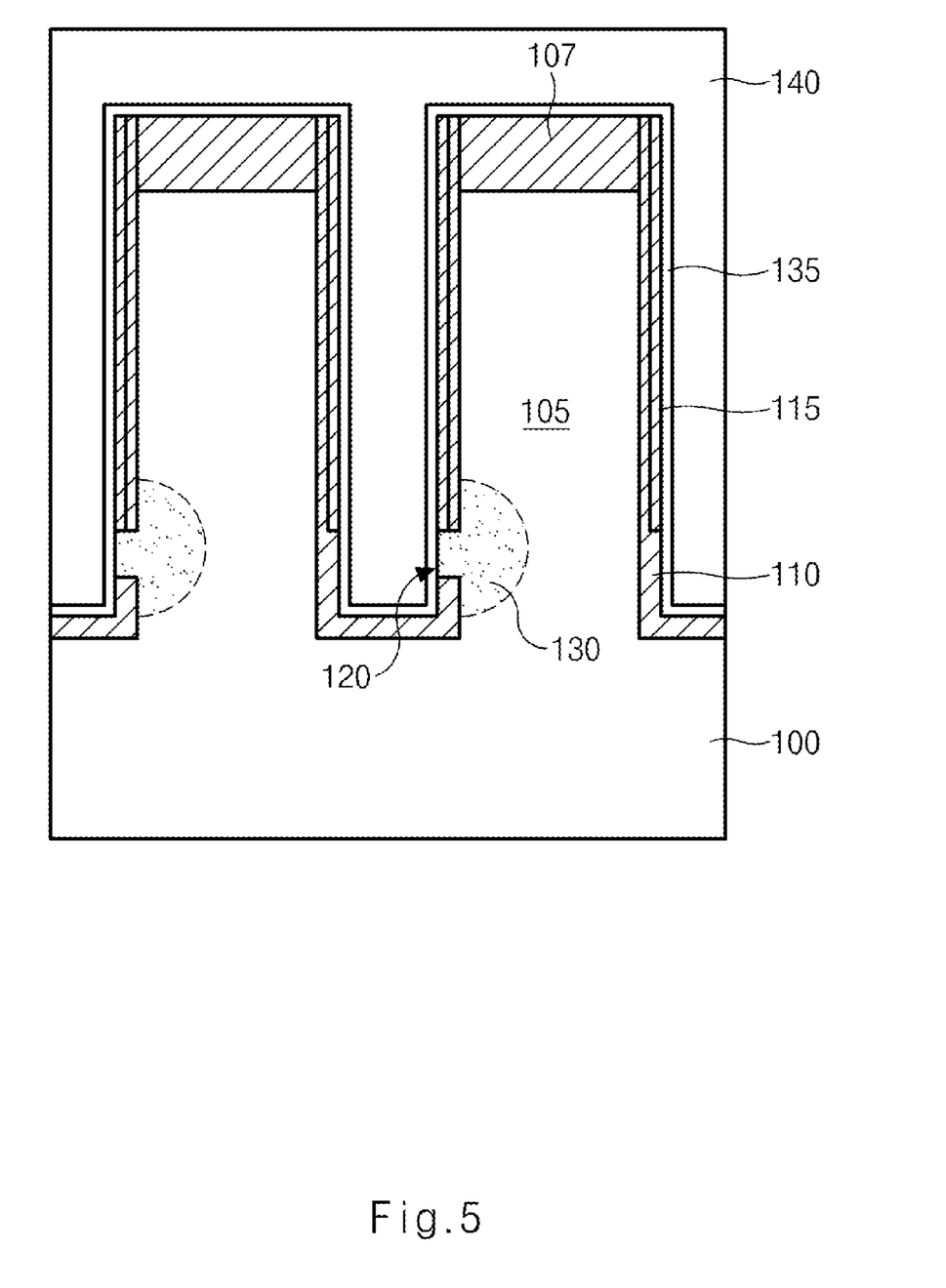

Referring to FIG. 5, the doped silicon layer 125a doped with ions is removed by a dry etch process. An anisotropic etch can be employed to remove the doped silicon layer 125a.

A barrier metal layer 135 is formed over the semiconductor substrate 100 including the pillar pattern 105, and a bit line conductive material 140 is formed over the resultant structure. The barrier metal layer 135 includes any of Ti, TiN and combinations thereof. If necessary, the barrier metal layer 135 includes cobalt (Co). The conductive material 140 preferably includes tungsten.

Figure 6:
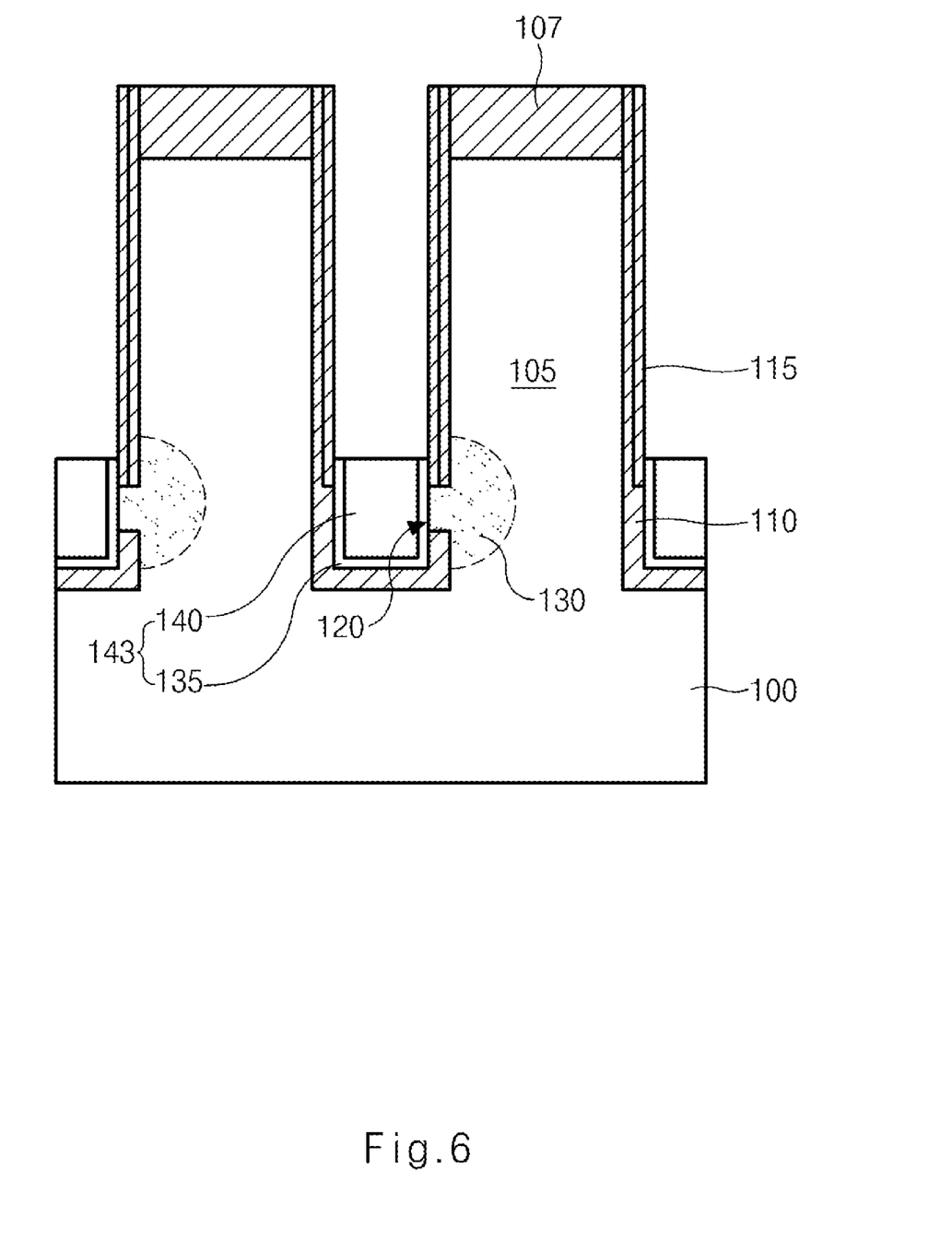

Referring to FIG. 6, the barrier metal layer 135 and the conductive material 140 are etched by an etch-back process to form a bit line 143 between neighboring pillar patterns 105. The bit line 143 extends to cover the sidewall contact 120. The barrier metal layer 135 and the conductive material 140 can be in a recessed shape filling in a lower space between the neighboring pillar patterns 105.

Figure 7:
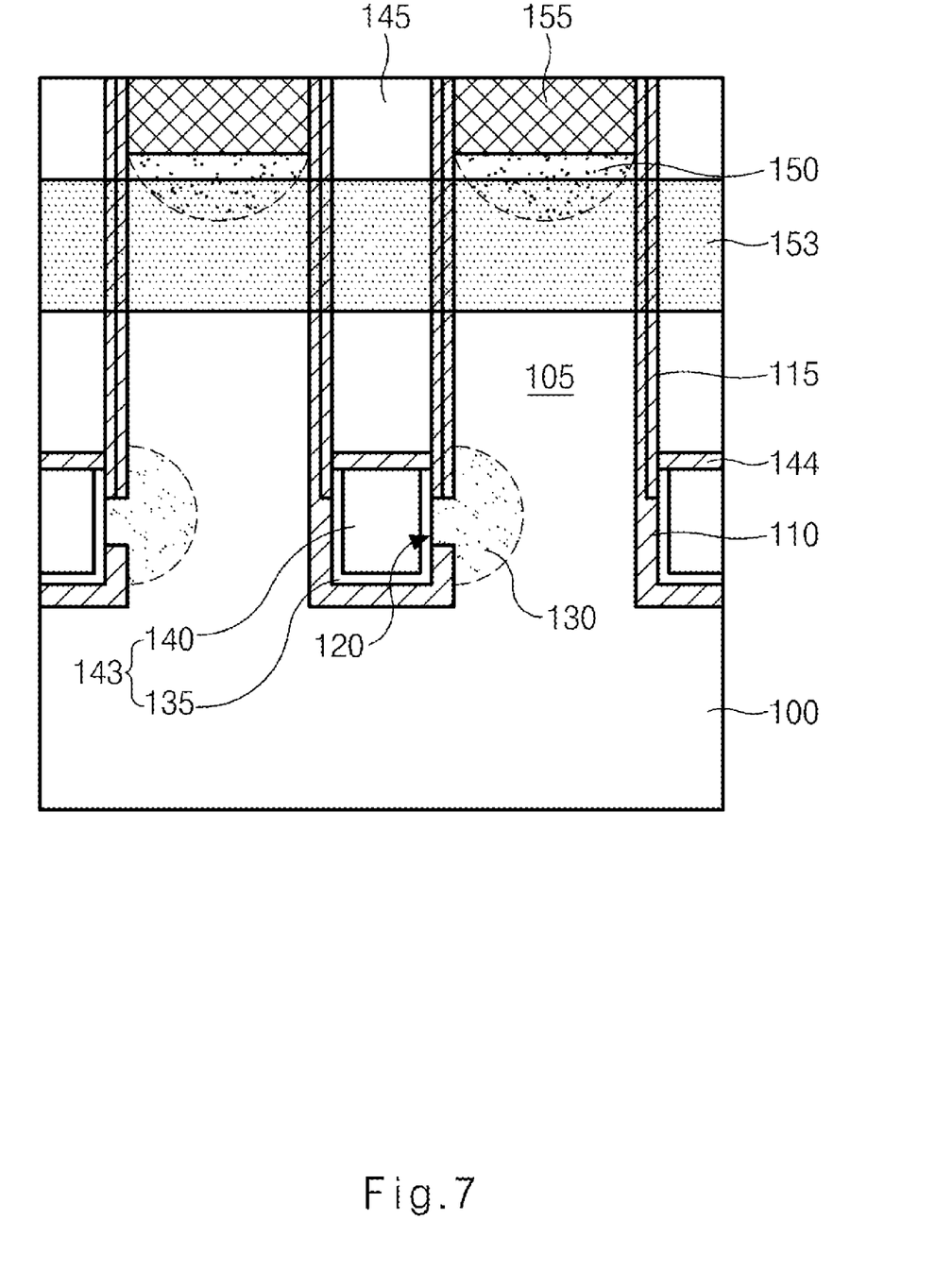

Referring to FIG. 7, an etch barrier film 144 is formed on the surface of the bit line 143, and an insulating film 145 is formed over the etch barrier film 144 in such a manner as filling in an upper space between the neighboring pillar patterns 105. The insulating film 145 is planarized to expose the upper side of the pillar pattern 105. A vertical gate (153) is formed, and the hard mask pattern 107 disposed over the pillar pattern 105 is removed to expose the top side of the pillar pattern 105. An ion implantation process is performed on the upper portion of the exposed pillar pattern 105 to form a second source/drain region 150.

A conductive material is formed over the second source/drain region 150 so as to be electrically coupled to the second source/drain region 150, thereby forming a plug 155. The conductive material includes polysilicon.

As described above, a method for manufacturing a semiconductor device according to an embodiment of the present invention comprises forming an element where a channel region is electrically connected to a semiconductor substrate, and unnecessary holes are not piled up in the channel region, thereby preventing a floating body effect. Also, unnecessary holes are not piled up in the channel region during the operation to inhibit reduction of a threshold voltage, thereby preventing mis-operation of the circuit. Additionally, the is process can be changed without using an additional mask process.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a semiconductor device, the method comprising:
   forming pillar patterns, each including a sidewall contact hole in a first diffusion barrier layer, over a semiconductor substrate, the pillar patterns including first and second pillar patterns;
   forming a silicon layer between the first and second pillar patterns, wherein the silicon layer is an epitaxially grown silicon layer formed using a Silicon Epitaxial Growth (SEG) method;
   implanting impurity ions into the silicon layer;

diffusing the implanted impurity ions from the silicon layer through the sidewall contact holes into the pillar patterns to form ion implanted regions;

removing substantially all of the silicon layer after forming the ion implanted regions; and forming a conductive pattern between the first and second pillar patterns, the conductive pattern coupled to the ion implanted region, wherein the conductive pattern is formed of material other than the silicon layer.

2. The method according to claim 1, wherein the pillar patterns each include silicon, and wherein the SEG method is performed using the pillar patterns exposed by the sidewall contact holes as a seed.

3. The method according to claim 1, wherein the implanting-impurity-ions-into-the-silicon-layer is performed by a plasma doping process or a diffusion furnace process.

4. The method according to claim 1, wherein the impurity ions have opposite conductivity to the semiconductor substrate.

5. The method according to claim 1, wherein in the implanting-impurity-ions-into-the-silicon-layer, the impurity ions include any of P, As, and a combination thereof, and wherein the semiconductor substrate is p-type.

6. The method according to claim 1, wherein of in the implanting-impurity-ions-into-the-silicon-layer, the impurity ions include any of B, $BF_2$, and a combination thereof, and wherein the semiconductor substrate is n-type.

7. The method according to claim 1, wherein in the implanting-impurity-ions-into-the-silicon-layer, the impurity ions are implanted with a concentration ranging from $1\times10^{10}$ to $1\times10^{20}$ dose/cm$^2$ using an energy ranging from about 1 to about 100 KeV.

8. The method according to claim 1, wherein the in the implanting-impurity-ions-into-the-silicon-layer, the impurity ions are diffused into the inside of the pillar patterns through the sidewall contact holes.

9. The method according to claim 1, wherein the ion-implanted regions are used as source/drain regions.

10. The method according to claim 1, wherein the implanting-impurity-ions-into-the-silicon-layer includes performing a thermal treatment process on the silicon layer.

11. The method according to claim 10, wherein the thermal treatment process is performed under an inert gas atmosphere.

12. The method according to claim 10, wherein the thermal treatment process is performed with an insert gas including any of $N_2$, Ar, and a combination thereof.

13. The method according to claim 1, wherein the removing-the-silicon-layer is performed by a dry etching process.

14. The method according to claim 1, the method further comprising forming a barrier metal layer between any of the ion implanted regions and the conductive pattern.

15. The method according to claim 14, wherein the barrier metal layer includes any of Ti, TiN, and a combination thereof.

16. The method according to claim 1, wherein the forming-a-conductive pattern further includes:

forming a conductive material over the semiconductor substrate, the conductive material filling a space between the pillar patterns; and etching the conductive material by an etch-back process so that the conductive material remains in a lower portion of the space between the pillar patterns.

17. The method according to claim 16, wherein the conductive material includes tungsten.

* * * * *